United States Patent [19]
Nagai

[11] Patent Number: 5,661,743
[45] Date of Patent: Aug. 26, 1997

[54] SEMICONDUCTOR LASER

[75] Inventor: Yutaka Nagai, Tokyo, Japan

[73] Assignee: Mitsubishi Denki Kabushiki Kaisha, Tokyo, Japan

[21] Appl. No.: 691,303

[22] Filed: Aug. 2, 1996

[30] Foreign Application Priority Data

Jan. 23, 1996 [JP] Japan .................................. 8-009172

[51] Int. Cl.⁶ ............................................. H01S 3/19
[52] U.S. Cl. ........................................ 372/46; 372/45
[58] Field of Search ............................ 372/46, 45, 44

[56] References Cited

U.S. PATENT DOCUMENTS

| | | | |
|---|---|---|---|
| 5,325,385 | 6/1994 | Kasukawa et al. | 372/46 |
| 5,351,258 | 9/1994 | Okumura et al. | 372/46 |

FOREIGN PATENT DOCUMENTS

| | | |
|---|---|---|
| 2106085 | 4/1990 | Japan . |
| 521902 | 1/1993 | Japan . |

OTHER PUBLICATIONS

Oh–hori et al., "Donor–Cation Vacancy Complex In Si–Doped AlGaAs Grown By Metalorganic Chemical Vapor Deposition", Journal of Applied Physics, vol. 61, No. 9, May 1987, pp. 4603–4605.

*Primary Examiner*—James W. Davie
*Attorney, Agent, or Firm*—Leydig, Voit & Mayer

[57] ABSTRACT

A semiconductor laser includes an n type GaAs semiconductor substrate, an n type AlGaAs cladding layer, an active layer producing light having a wavelength equal to or larger than 900 nm, a p type AlGaAs cladding layer, and an n type AlGaAs current blocking layer having a current concentrating structure. The n type AlGaAs current blocking layer comprises $Al_xGa_{1-x}As$ having an Al composition ratio x smaller than an Al composition ratio of the p type AlGaAs cladding layer, and is doped with Si to a concentration equal to or larger than $1 \times 10^{19}$ cm$^{-3}$. Therefore, since more $V_{III}$-$Si_{Ga}$ complexes C are produced in the AlGaAs current blocking layer than those produced when the current blocking layer is GaAs and absorption of light having a wavelength of 0.9~1.2 μm is promoted, generation of higher-order modes is reliably suppressed and laser light having a fundamental mode is stably produced. Consequently, a semiconductor laser for exciting a fiber amplifier and excellent as a pumping light source of an optical fiber is realized.

4 Claims, 9 Drawing Sheets

Prior Art

SEMICONDUCTOR LASER

FIELD OF THE INVENTION

The present invention relates to a semiconductor laser and a fabricating method thereof and, more particularly, to a semiconductor laser for exciting a fiber amplifier doped with Er (erbium) or Pr (praseodymium) and a fabricating method thereof.

BACKGROUND OF THE INVENTION

Figure 8:
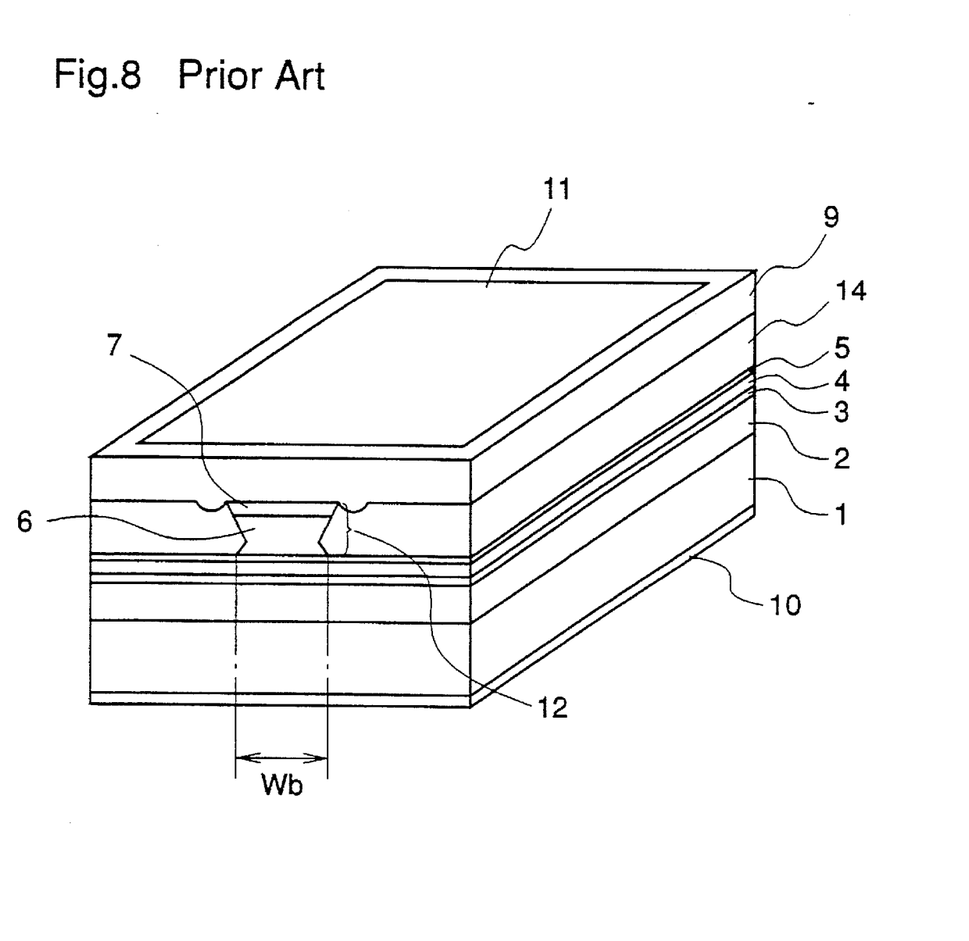
FIG. 8 is a perspective view illustrating a prior art semiconductor laser.

FIG. 8 is a perspective view illustrating a prior art semiconductor laser including a ridge structure (hereinafter referred to as a ridge type semiconductor laser), and FIGS. 9(a)–9(e) are cross-sectional views illustrating process steps in a method of fabricating the semiconductor laser. FIG. 10 is a diagram illustrating a refractive index profile in a ridge region of the semiconductor laser.

In FIG. 8, reference numeral 1 designates an n type GaAs semiconductor substrate. An n type AlGaAs cladding layer 2 comprising $Al_{0.5}Ga_{0.5}As$ is disposed on the n type GaAs semiconductor substrate 1. A quantum-well active layer 3 comprising undoped InGaAs is disposed on the n type AlGaAs cladding layer 2. A p type AlGaAs first cladding layer 4 comprising $Al_{0.5}Ga_{0.5}As$ is disposed on the quantum-well active layer 3. A p type AlGaAs etch stopping layer 5 comprising $Al_{0.7}Ga_{0.3}As$ is disposed on the p type AlGaAs first cladding layer 4. A p type AlGaAs second cladding layer 6 comprising $Al_{0.5}Ga_{0.5}As$ and a p type GaAs first contact layer 7 are successively disposed on the p type AlGaAs etch stopping layer 5, and have a stripe-shaped ridge structure. Reference numeral 12 designates a ridge waveguide, and the ridge waveguide 12 has a width Wb in a range of 1~1.5 μm at a boundary between the ridge waveguide and the p type AlGaAs etch stopping layer 5. N type AlGaAs current blocking layers 14 comprising $Al_{0.7}Ga_{0.3}As$ are disposed on the p type AlGaAs etch stopping layer 5 at both sides of the ridge structure comprising the p type AlGaAs second cladding layer 6 and the p type GaAs first contact layer 7. A p type GaAs second contact layer 9 is disposed on the ridge structure and on the n type AlGaAs current blocking layers 14. A p side electrode 10 is disposed on a rear surface of the n type GaAs semiconductor substrate 1, and an n side electrode 11 is disposed on the p type GaAs second contact layer 9.

A description is given of the fabricating method.

Figure 9:
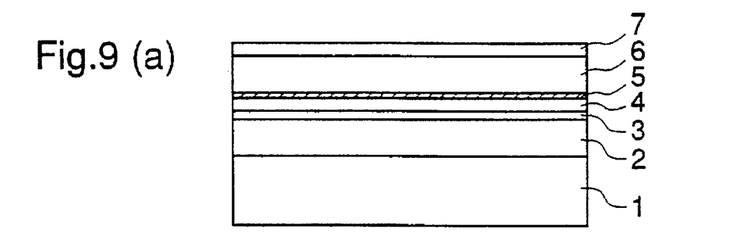
FIGS. 9(a)-9(e) are cross-sectional views illustrating process steps in a method of fabricating the prior art semiconductor laser.
Figure 10:
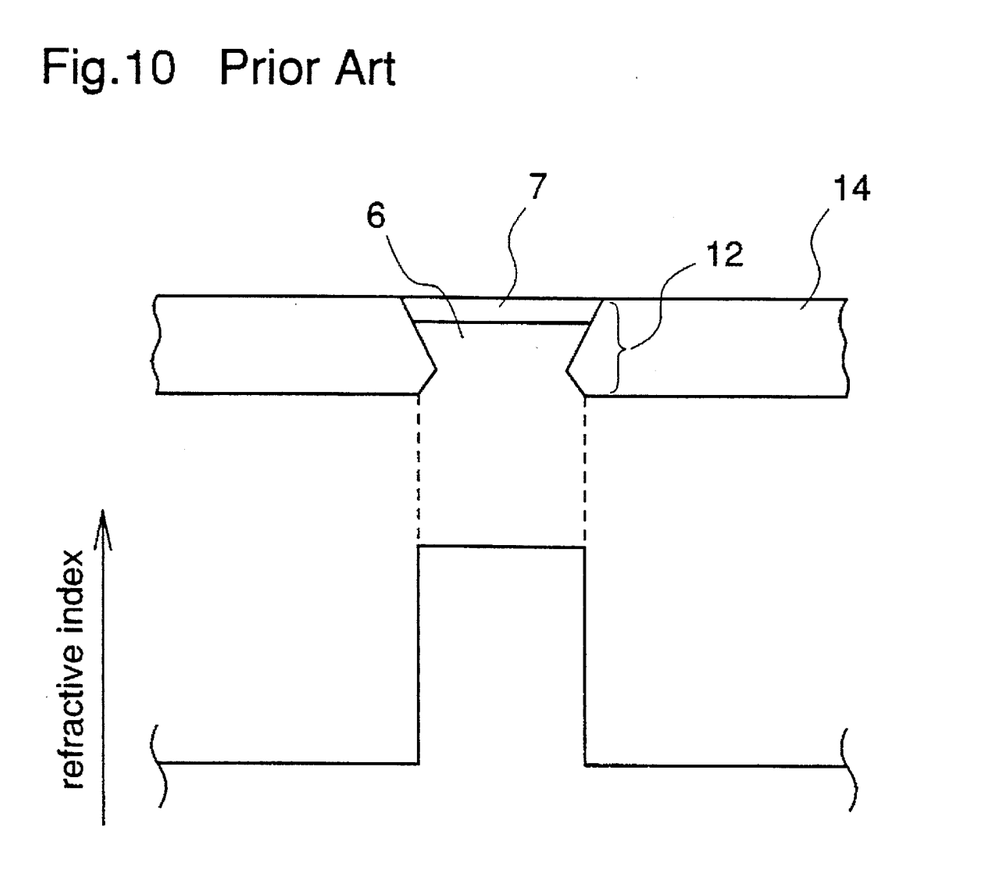
FIG. 10 is a refractive index profile in a direction parallel to a pn junction, in a ridge structure of the prior art semiconductor laser.

Initially, as shown in FIG. 9(a), the n type AlGaAs cladding layer 2, the InGaAs quantum-well active layer 3, the p type AlGaAs first cladding layer 4, the p type AlGaAs etch stopping layer 5, the p type AlGaAs second cladding layer 6, and the p type GaAs first contact layer 7 are successively epitaxially grown on the n type GaAs semiconductor substrate 1, preferably by metal organic chemical vapor deposition (MOCVD).

Next, as shown in FIG. 9(b), a stripe-shaped insulating film 13 comprising $Si_3N_4$ or $SiO_2$ is deposited on the p type GaAs first contact layer 7. The insulating film 13 serves as a mask for ridge etching. In the step of FIG. 9(c), using the insulating film 13 as a mask, the p type AlGaAs second cladding layer 6 and the p type GaAs first contact layer 7 are selectively etched to form a stripe-shaped ridge structure. The selective etching is performed using an etchant, such as a solution of tartaric acid and hydrogen peroxide, that does not etch the p type AlGaAs etch stopping layer 5 but etches the p type AlGaAs second cladding layer 6 and the p type GaAs first contact layer 7. Therefore, the ridge structure comprising the p type AlGaAs second cladding layer 6 and the p type GaAs first contact layer 7 can be formed with good reproducibility.

Thereafter, as shown in FIG. 9(d), the n type AlGaAs current blocking layer 14 is grown on both sides of the ridge structure to bury portions of the p type AlGaAs second cladding layer 6 and the p type GaAs first contact layer 7 which are removed by the etching. Since the insulating film 13 serves as a mask during the crystal growth, the n type AlGaAs current blocking layer 14 is not grown on the ridge structure.

In the step of FIG. 9(e), after removing the insulating film 13 by wet etching or dry etching, the p type GaAs second contact layer 9 is grown on the entire surface. The n side electrode 10 is formed on the n type GaAs semiconductor substrate 1 and the p side electrode 11 is formed on the p type GaAs second contact layer 9, resulting in the semiconductor laser shown in FIG. 8.

A description is given of the operation.

When a voltage is applied across the electrodes so that the p side electrode 11 is plus and the n side electrode 10 is minus, holes are injected into the quantum-well active layer 3 through the p type GaAs second contact layer 9, the p type GaAs first contact layer 7, the p type AlGaAs second cladding layer 6, the p type AlGaAs etch stopping layer 5, and the p type AlGaAs first cladding layer 4 and electrons are injected into the quantum-well active layer 3 through the n type GaAs semiconductor substrate 1 and the n type AlGaAs cladding layer 2. Then, the electrons and holes recombine in the quantum-well active layer 3 and stimulated emission light is generated therein. When the quantity of carriers (electrons and holes) which are injected into the active layer is sufficiently large and light exceeding the waveguide loss is produced, laser oscillation occurs.

In a region in the vicinity of the n type AlGaAs current blocking layer 14 except the stripe-shaped ridge region, pn junctions are formed at the interfaces between the n type AlGaAs current blocking layer 14 and the p type AlGaAs first cladding layer 4 and between the n type AlGaAs current blocking layer 14 and the p type GaAs second contact layer 9. Therefore, even when a voltage is applied so that the p side electrode 11 is plus, the region in the vicinity of the n type AlGaAs current blocking layer 14 is reversely biased because of the p-n-p junction, so that no current flows through this region. That is, the n type AlGaAs current blocking layer 14 blocks current flow. Consequently, a current flows only through the ridge region and is concentrated only in a central portion of the quantum-well active layer 3 just below the ridge region, whereby a current density sufficient to produce laser oscillation is achieved.

A description is given of a waveguide structure for laser light in the prior art semiconductor laser.

Generally, in a semiconductor laser, various structural devices have been used in order to realize a unimodal laser beam having a fundamental transverse mode. More specifically, a semiconductor laser has a waveguide structure comprising a double heterostructure in a direction perpendicular to a pn junction, i.e., in a direction perpendicular to a substrate surface, whereby a laser beam having a fundamental transverse mode is produced stably. Therefore, in the prior art semiconductor laser, since the AlGaAs cladding layers 2, 4, and 6 have respective refractive indices smaller than the refractive index of the InGaAs quantum-well active layer 3, the laser light is guided in the quantum-well active layer 3 having a relatively large refractive index. This is because light has the property of passing through a medium having a large refractive index.

In addition, in a ridge type semiconductor laser, a ridge waveguide has a refractive index profile as shown in FIG. 10 in a direction parallel to the pn junction, i.e., in a direction parallel to the substrate surface, whereby a laser beam having a fundamental transverse mode is produced. Therefore, in the prior art semiconductor laser, since the p type AlGaAs cladding layer 6 in the ridge waveguide 12 has a refractive index larger than that of the n type AlGaAs current blocking layer 14, the laser light is guided along the ridge waveguide 12. Consequently, the horizontal transverse mode that is an important characteristic of the semiconductor laser becomes stable and unimodal.

As described above, the prior art semiconductor laser shown in FIG. 8 guides the light, utilizing the difference in refractive index in the ridge structure. In this semiconductor laser, however, in view of mode control, the waveguide width Wb at the boundary between the ridge waveguide 12 and the etch stopping layer 5 must be in a range of 1~1.5 µm. It is probable that a semiconductor laser having a waveguide width Wb larger than 1.5 µm produces higher-order modes higher than or equal to the second-order mode as well as a fundamental mode, and the semiconductor laser producing the higher-order modes shows a nonlinear characteristic called a "kink" in the current-light output characteristic, which adversely affects the laser in practical use. Further, when the semiconductor laser is used to output the laser beam to a fiber, generation of a multimodal laser beam having higher-order modes would exceptionally lower the coupling efficiency between the fiber and the semiconductor laser. Consequently, in order to fabricate this kind of semiconductor laser stably, it is desirable that the waveguide width Wb should be about 1 µm, considering its margin.

However, when the waveguide width Wb is small, current density during operation becomes extremely high, or optical density at the semiconductor laser facet becomes high. Generally, reliability of a semiconductor laser is reduced by internal deterioration and facet destruction. The internal deterioration is caused by an increase of dislocations in an active layer at high current density, and facet destruction is caused by melting of facet portions resulting from high optical density. Therefore, in the prior art semiconductor laser shown in FIG. 8, since the waveguide width Wb is small, i.e., 1~1.5 µm, internal deterioration under high current density and facet destruction resulting from high optical density occur, so that reliability of the semiconductor laser is extremely reduced.

In addition, the half-power angular width of the horizontal transverse mode depends on the waveguide width Wb. As the waveguide width Wb is reduced, the half-power angular width varies greatly even when the width Wb varies slightly. Accordingly, the half-power angular width of the horizontal transverse mode varies widely as the waveguide width Wb is reduced, whereby the fabrication yield of the semiconductor laser is reduced. Consequently, in the prior art semiconductor laser shown in FIG. 8, since the waveguide width Wb is small, i.e., 1~1.5 µm, the half-power angular width of the horizontal transverse mode varies widely, whereby the fabrication yield of the semiconductor laser is reduced.

Further, the prior art semiconductor laser shown in FIG. 8 includes the current blocking layer 14 comprising $Al_{0.7}Ga_{0.3}As$, and has a structure utilizing the difference in refractive index in the ridge structure, i.e., a refractive index type structure. Therefore, the light extending to both sides of the ridge structure is not absorbed, so that it is probable to produce higher-order modes having peaks at the end portions of the ridge waveguide, whereby the coupling efficiency between the semiconductor laser and the optical fiber is lowered.

Patent Application No. Hei. 7-178759 discloses another prior art ridge type semiconductor laser in which a quantum-well active layer emitting laser light having a wavelength of 0.98 µm and a ridge waveguide comprising a p type $Al_{0.5}Ga_{0.5}As$ cladding layer having a width of 2~5 µm are disposed on an n type GaAs semiconductor substrate, and $Al_{0.7}Ga_{0.3}As$ current blocking layers doped with Er as a metal for absorbing the laser light having a wavelength of 0.98 µm are disposed at both sides of the ridge waveguide.

The above-described prior art semiconductor laser includes a loss guide type structure in which the Er-doped $Al_{0.7}Ga_{0.3}As$ current blocking layer is used in place of the n type AlGaAs current blocking layer 14 in the prior art semiconductor laser shown in FIG. 8 and the laser light is absorbed by this Er-doped AlGaAs current blocking layer. More specifically, in this prior art semiconductor laser, Er ions in the current blocking layer absorb the laser light having a wavelength of 0.98 µm which is emitted from the quantum-well active layer just below the ridge waveguide. The absorption of the laser light by the current blocking layer is promoted more at the end portions than at the center portion of the ridge waveguide, whereby gains of higher-order modes having the peaks at the end portions of the ridge waveguide are reduced. Consequently, according to this prior art semiconductor laser, even when the waveguide width is 2~5 µm, a unimodal laser beam having a fundamental transverse mode is produced stably.

Figure 11:
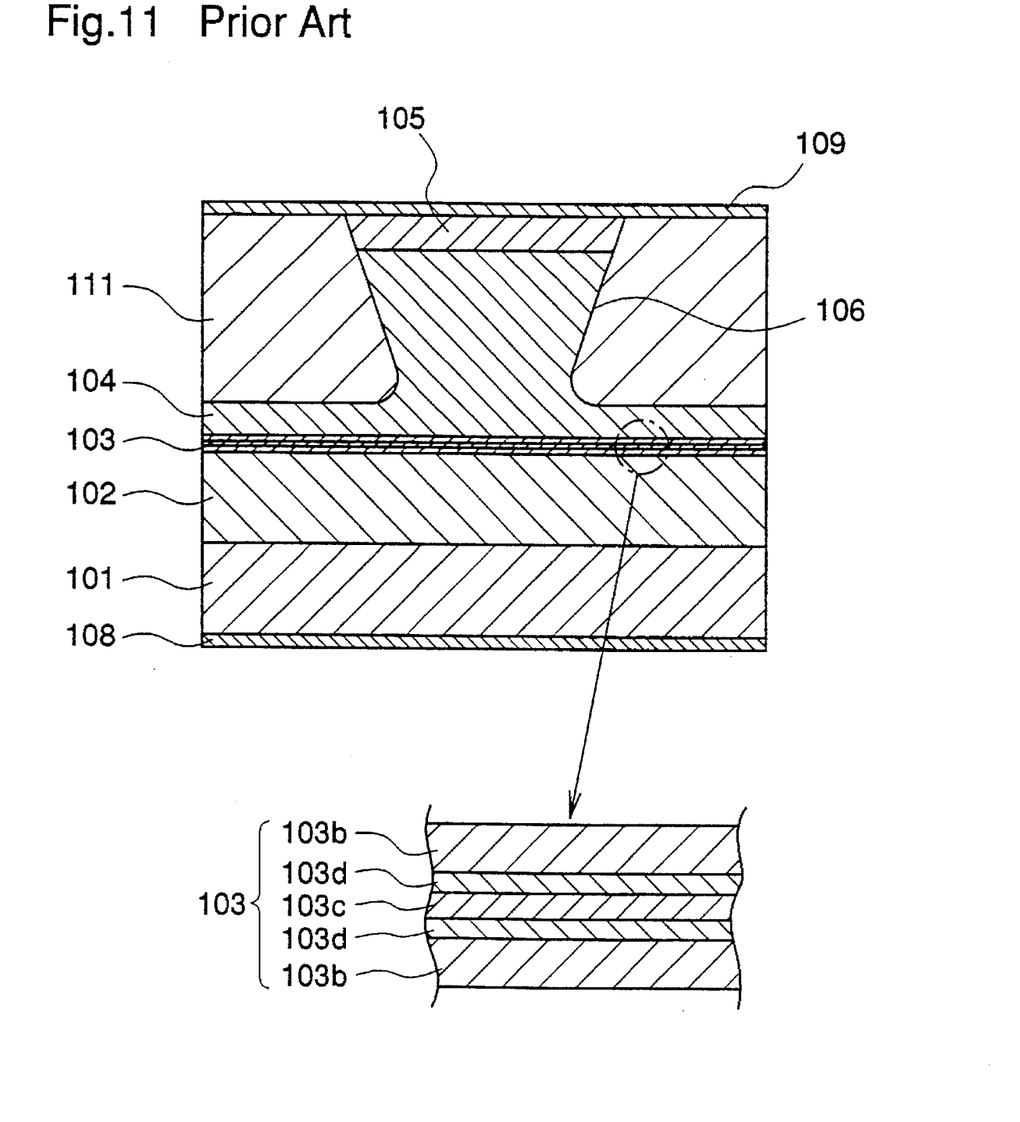
FIG. 11 is a cross-sectional view illustrating another prior art semiconductor laser.

FIG. 11 is a cross-sectional view illustrating another prior art semiconductor laser disclosed in Japanese Published Patent Application No. Hei. 5-21902. In the figure, reference numeral 101 designates an n type GaAs substrate. An $Al_{0.5}Ga_{0.5}As$ lower cladding layer 102, a double quantum-well active layer 103, a p type $Al_{0.5}Ga_{0.5}As$ upper cladding layer 104, and a p type GaAs ohmic contact layer 105 are successively disposed on the n type GaAs substrate 101. The p type $Al_{0.5}Ga_{0.5}As$ upper cladding layer 104 and the p type GaAs ohmic contact layer 105 have a stripe-shaped ridge structure 106 produced by selective etching. N type GaAs current blocking layers 111 doped with silicon (Si) are disposed so as to bury portions of the upper cladding layer 104 and the ohmic contact layer 105 which are removed by the etching. An n side electrode 108 is disposed on a rear surface of the GaAs substrate 101 and a p side electrode 109 is disposed on the ridge structure and on the current blocking layers 111. The active layer 103 has a quantum-well structure comprising an $Al_{0.3}Ga_{0.7}As$ barrier layer 103c, two GaAs quantum-well layers 103d, and two $Al_{0.3}Ga_{0.7}As$ guiding layers 103b. The AlGaAs barrier layer 103c is sandwiched between the two GaAs quantum-well layers 103d, and further, the GaAs quantum-well layers 103d are sandwiched between the two AlGaAs Guiding layers 103b.

In the prior art semiconductor laser shown in figure 11, the n type GaAs current blocking layer 111 is doped with Si to a high concentration, the current blocking layer 111 has an n type carrier concentration equal to or larger than $6 \times 10^{18}$ $cm^{-3}$, and the current blocking layer 111 absorbs light having a wavelength equal to or larger than 900 nm which travels from the active layer 103 to the n type GaAs current blocking layer 111 through the upper cladding layer 104 during laser oscillation. More specifically, according to this prior art semiconductor laser shown in FIG. 11, since a broad deep level extending over a 900~1000 nm band is formed in the n type GaAs current blocking layer 111, the current blocking layer 111 absorbs the light having a wavelength equal to or larger than 900 nm which travels from both sides of the light emitting portion to the current blocking layer 111 through the upper cladding layer 104, whereby generation of higher-order modes is suppressed and a fundamental mode is produced.

In the prior art semiconductor laser disclosed by Patent Application No. Hei. 7-178759, however, when the current blocking layer is doped with Er, the absorption peak is shifted from 0.98 μm due the narrow absorption band; Er ions have an absorption band for light having a wavelength of 0.98 μm. Therefore, it is impossible to suppress the generation of the higher-order modes reliably.

In the prior art semiconductor laser shown in figure 11, the broad deep level is formed in the vicinity of a 900 ~1000 nm band in the n type GaAs current blocking layer 111 which is doped with Si to a high concentration. However, due to insufficient light absorption, the generation of the higher-order modes cannot be suppressed reliably.

SUMMARY OF THE INVENTION

It is an object of the present invention to provide a semiconductor laser producing laser light having a wavelength of 0.9~1.2 μm, in which a unimodal laser beam having a fundamental transverse mode is produced stably and securely, and a method of fabricating the semiconductor laser.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, a semiconductor laser includes an n type GaAs semiconductor substrate, an n type AlGaAs cladding layer, an active layer producing light having a wavelength equal to or larger than 900 nm, a p type AlGaAs cladding layer, and an n type AlGaAs current blocking layer having a current concentrating structure. The n type AlGaAs current blocking layer comprises $Al_xGa_{1-x}As$ having an Al composition ratio x smaller than an Al composition ratio of the p type AlGaAs cladding layer, and is doped with Si to a concentration equal to or larger than $1\times10^{19}$ cm$^{-3}$. Therefore, since more $V_{III}$-$Si_{Ga}$ complexes C are produced in the AlGaAs current blocking layer than those produced when the current blocking layer comprises GaAs and absorption of light having a wavelength of 0.9~1.2 μm is promoted, generation of higher-order modes is securely suppressed and laser light having a fundamental mode is stably produced. Consequently, a semiconductor laser for exciting a fiber amplifier excellent as a pumping light source of an optical fiber is realized.

According to a second aspect of the present invention, in the above-described semiconductor laser, the n type AlGaAs current blocking layer has an Al composition ratio x larger than 0 and equal to or smaller than 0.3. Therefore, since more $V_{III}$-$Si_{Ga}$ complexes C are produced in the AlGaAs current blocking layer than those produced when the current blocking layer comprises GaAs and absorption of light having a wavelength of 0.9~1.2 μm is promoted, generation of higher-order modes is securely suppressed and laser light having a fundamental mode is stably produced. Consequently, a semiconductor laser for exciting a fiber amplifier excellent as a pumping light source of an optical fiber is realized.

According to a third aspect of the present invention, in the above-described semiconductor laser, the current concentrating structure is a ridge type structure comprising the p type AlGaAs cladding layer having a stripe-shaped ridge structure, and the n type AlGaAs current blocking layer disposed on both sides of the p type AlGaAs cladding layer. Therefore, since more $V_{III}$-$Si_{Ga}$ complexes C are produced in the AlGaAs current blocking layer and absorption of light having a wavelength of 0.9~1.2 μm is promoted, generation of higher-order modes having the peaks at end portions of a ridge waveguide is securely suppressed and laser light having a fundamental mode is stably produced. Consequently, a semiconductor laser for exciting a fiber amplifier excellent as a pumping light source of an optical fiber is realized.

According to a fourth aspect of the present invention, in the above-described semiconductor laser, the current concentrating structure is an SAS (self-aligned structure) type structure comprising the n type AlGaAs current blocking layer having a stripe groove in the center, and the p type AlGaAs cladding layer disposed on the entire surface of the n type AlGaAs current blocking layer including the stripe groove. Therefore, since more $V_{III}$-$Si_{Ga}$ complexes C are produced in the AlGaAs current blocking layer and absorption of light having a wavelength of 0.9~1.2 μm is promoted, generation of higher-order modes having the peaks at end portions of a waveguide is securely suppressed and laser light having a fundamental mode is stably produced. Consequently, a semiconductor laser for exciting a fiber amplifier excellent as a pumping light source of an optical fiber is realized.

According to a fifth aspect of the present invention, a method of fabricating a semiconductor laser includes successively forming an n type AlGaAs cladding layer, an active layer, a p type AlGaAs first cladding layer, a p type AlGaAs etch stopping layer, a p type AlGaAs second cladding layer, and a p type GaAs first contact layer on an n type GaAs semiconductor substrate; depositing a stripe-shaped insulating film on the p type GaAs first contact layer; using the insulating film as a mask, etching the p type GaAs first contact layer and the p type AlGaAs second cladding layer selectively with respect to the p type AlGaAs etch stopping layer using an etchant that does not etch the p type AlGaAs etch stopping layer but etches the p type GaAs first contact layer and the p type AlGaAs second cladding layer, thereby forming a stripe-shaped ridge structure comprising the p type GaAs first contact layer and the p type AlGaAs second cladding layer; forming an n type AlGaAs current blocking layer comprising $Al_xGa_{1-x}As$ having an Al composition ratio x larger than 0 and equal to or smaller than 0.3 which is doped with Si to a concentration equal to or larger than $1\times10^{19}$ cm$^{-3}$ on both sides of the ridge structure to bury portions of the p type GaAs first contact layer and the p type AlGaAs second cladding layer which are removed by the etching; after removing the stripe-shaped insulating film by etching, forming a p type GaAs second contact layer on the entire surface; and forming an n side electrode on the rear surface of the n type GaAs semiconductor substrate and forming a p side electrode on the p type GaAs second contact layer. Consequently, a ridge type semiconductor laser emitting unimodal laser light having a stable fundamental transverse mode is fabricated.

According to a sixth aspect of the present invention, a method of fabricating a semiconductor laser includes successively forming an n type AlGaAs cladding layer, an active layer, a p type AlGaAs first cladding layer, and an n type AlGaAs current blocking layer comprising $Al_xGa_{1-x}As$ having an Al composition ratio x larger than 0 and equal to or smaller than 0.3 which is doped with Si to a concentration equal to or larger than $1\times10^{19}$ cm$^{-3}$ on an n type GaAs semiconductor substrate; depositing an insulating film having a stripe-shaped aperture on the n type AlGaAs current blocking layer; using the insulating film as a mask, selectively etching the n type AlGaAs current blocking layer until a surface of the p type AlGaAs first cladding layer is exposed, thereby forming a stripe groove in the n type AlGaAs current blocking layer; after removing the insulating film by etching, successively forming a p type AlGaAs second cladding layer and a p type GaAs contact layer on the entire surface of the n type AlGaAs current blocking layer and on the exposed surface of the p type AlGaAs first cladding layer to bury the stripe groove in the n type AlGaAs current blocking layer; and forming an n side electrode on the rear surface of the n type GaAs semiconductor substrate and forming a p side electrode on the p type GaAs contact layer. Consequently, an SAS type semiconductor laser emitting unimodal laser light having a stable fundamental transverse mode is fabricated.

DETAILED DESCRIPTION OF THE PREFERRED EMBODIMENT

[Embodiment 1]

Figure 1:
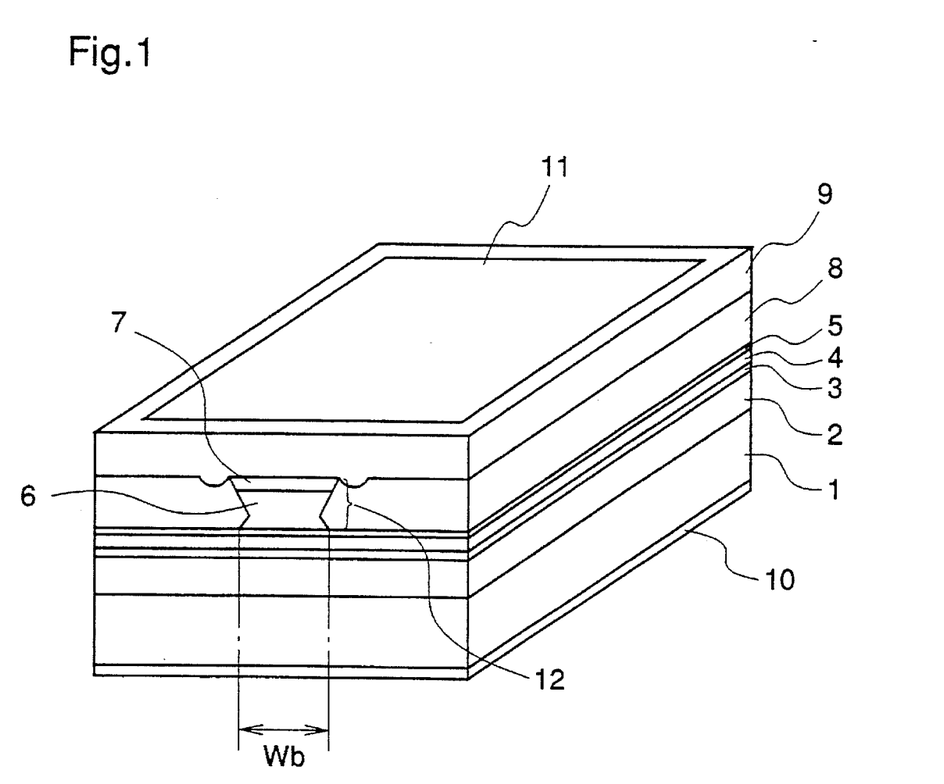
FIG. 1 is a perspective view illustrating a semiconductor laser in accordance with a first embodiment of the present invention.

FIG. 1 is a perspective view illustrating a semiconductor laser including a ridge structure (hereinafter referred to as a ridge type semiconductor laser) according to a first embodiment of the present invention. This semiconductor laser of the first embodiment is used as a light source for exciting an Er-doped fiber amplifier. In the figure, reference numeral 1 designates an n type GaAs semiconductor substrate having a thickness of 100 μm and a dopant concentration of $1 \sim 3 \times 10^{18}$ cm$^{-3}$. An n type AlGaAs cladding layer 2 comprising $Al_{0.5}Ga_{0.5}As$ and having a thickness of 2.0 μm and a dopant concentration of $4 \times 10^{17}$ cm$^{-3}$ is disposed on the n type GaAs semiconductor substrate 1. A quantum-well active layer 3 comprising undoped InGaAs and having a thickness of 1.0 μm is disposed on the n type AlGaAs cladding layer 2. The structure of the quantum-well active layer 3 is detailed later. A p type AlGaAs first cladding layer 4 comprising $Al_{0.5}Ga_{0.5}As$ and having a thickness of 0.1~0.3 μm and a dopant concentration of $2 \times 10^{18}$ cm$^{-3}$ is disposed on the quantum-well active layer 3. A p type AlGaAs etch stopping layer 5 comprising $Al_{0.7}Ga_{0.3}As$ and having a thickness of 20 nm and a dopant concentration of $2 \times 10^{18}$ cm$^{-3}$ is disposed on the p type AlGaAs first cladding layer 4. A p type AlGaAs second cladding layer 6 comprising $Al_{0.5}Ga_{0.5}As$ and having a thickness of 1.5~1.8 μm and a dopant concentration of $2 \times 10^{18}$ cm$^{-3}$, and a p type GaAs first contact layer 7 having a thickness of 0.2 μm and a dopant concentration of $2 \times 10^{19}$ cm$^{-3}$ are successively disposed on the p type AlGaAs etch stopping layer 5, and have a stripe-shaped ridge structure. Reference numeral 12 designates a ridge waveguide, and the ridge waveguide 12 has a width Wb in a range of 2~4 μm at a boundary between the ridge waveguide and the p type AlGaAs etch stopping layer 5. N type AlGaAs current blocking layers 8 are disposed on the p type AlGaAs etch stopping layer 5 at both sides of the ridge structure comprising the p type AlGaAs second cladding layer 6 and the p type GaAs first contact layer 7. The n type AlGaAs current blocking layers 8 comprise $Al_{0.2}Ga_{0.8}As$ doped with Si to a concentration equal to or larger than $1 \times 10^{19}$ cm$^{-3}$ and have a thickness of 1.5 μm. A p type GaAs second contact layer 9 having a thickness of 2, μm and a dopant concentration of $2 \times 10^{19}$ cm$^{-3}$ is disposed on the ridge structure comprising the p type AlGaAs second cladding layer 6 and the p type GaAs first contact layer 7 and on the n type AlGaAs current blocking layers 8. A p side electrode 10 is disposed on a rear surface of the n type GaAs semiconductor substrate 1, and an n side electrode 11 is disposed on the p type GaAs second contact layer 9.

The semiconductor laser according to the first embodiment differs from the prior art semiconductor laser in that the current blocking layer is the n type AlGaAs layer comprising $Al_{0.2}Ga_{0.8}As$ having an Al composition ratio x of 0.2 which is doped with Si to a concentration equal to or larger than $1 \times 10^{19}$ cm$^{-3}$. The waveguide structure in this semiconductor laser is a loss guide type structure that is different from the refractive index type structure as in the prior art semiconductor laser shown in FIG. 8.

A description is given of the fabricating method.

Figure 2:
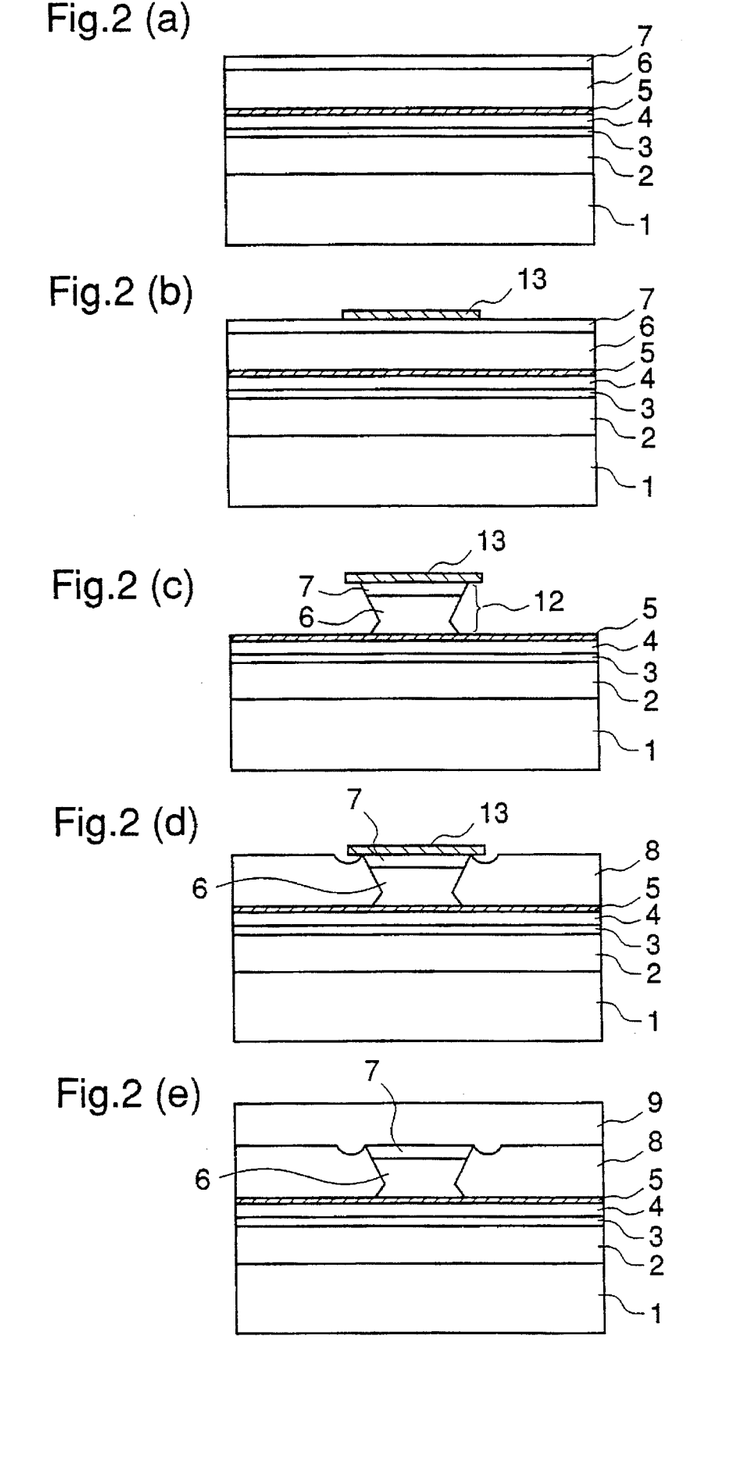
FIGS. 2(a)-2(e) are cross-sectional views illustrating process steps in a method of fabricating the semiconductor laser according to the first embodiment of the invention.

FIGS. 2(a)-2(e) are cross-sectional views illustrating process steps in the fabricating method. Initially, as shown in FIG. 2(a), the n type $Al_{0.5}Ga_{0.5}As$ cladding layer 2, the quantum-well active layer 3, the p type $Al_{0.5}Ga_{0.5}As$ first cladding layer 4, the p type $Al_{0.7}Ga_{0.3}As$ etch stopping layer 5, the p type $Al_{0.5}Ga_{0.5}As$ second cladding layer 6, and the p type GaAs first contact layer 7 are successively epitaxially grown on the n type GaAs semiconductor substrate 1, preferably by metal organic chemical vapor deposition (MOCVD). The growth of the layers except the active layer 3 is carried out under the conditions of a growth temperature of about 700° C., a V/III ratio of 200, and a growth speed of 1 μm/h.

Next, as shown in FIG. 2(b), a stripe-shaped insulating film 13 comprising $Si_3N_4$ or $SiO_2$ is deposited on the p type GaAs first contact layer 7. The insulating film 13 serves as a mask for ridge etching. In the step of FIG. 2(c), using the insulating film 13 as a mask, the p type AlGaAs second cladding layer 6 and the p type GaAs first contact layer 7 are selectively etched to form a stripe-shaped ridge structure. The etching is performed using an etchant, such as a solution of tartaric acid and hydrogen peroxide, that does not etch the p type AlGaAs etch stopping layer 5 but etches the p type AlGaAs second cladding layer 6 and the p type GaAs first contact layer 7, whereby the ridge structure can be formed with good reproducibility. Thereafter, as shown in FIG. 2(d), the n type $Al_{0.2}Ga_{0.8}As$ current blocking layer 8 doped with Si to a concentration equal to or larger than $1\times10^{19}$ cm$^{-3}$ is grown on both sides of the ridge structure to bury portions of the p type AlGaAs second cladding layer 6 and the p type GaAs first contact layer 7 which are removed by the etching. Since the insulating film 13 serves as a mask during the crystal growth, the n type AlGaAs current blocking layer 8 is not grown on the ridge structure.

In the step of FIG. 2(e), after removing the insulating film 13 by wet etching or dry etching, the p type GaAs second contact layer 9 is grown on the entire surface.

Finally, the n side electrode 10 is formed on the n type GaAs semiconductor substrate 1 and the p side electrode 11 is formed on the p type GaAs second contact layer 9, resulting in the semiconductor laser shown in FIG. 1.

Figure 3:
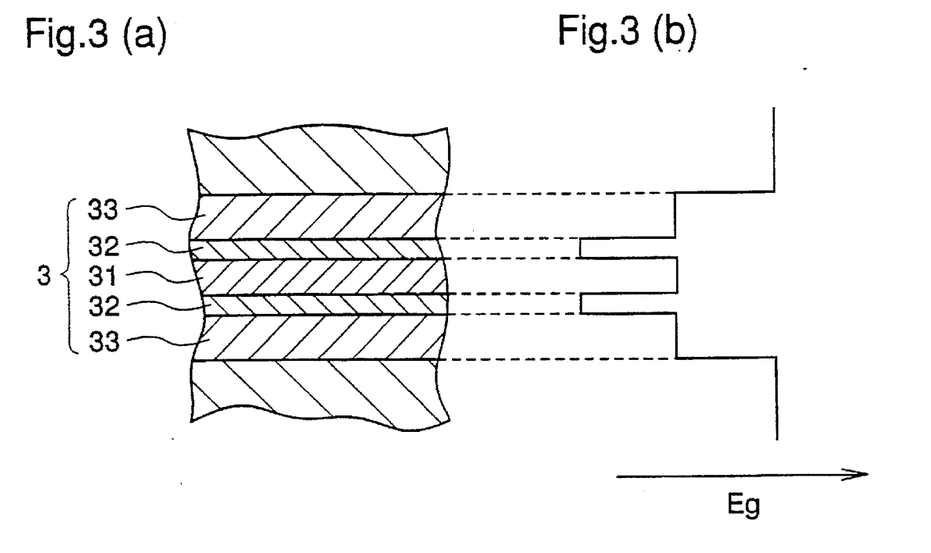
FIG. 3 is a cross-sectional view illustrating an active layer of the semiconductor laser according to the first embodiment of the invention.

In the semiconductor laser according to the first embodiment, the quantum-well active layer 3 is formed so as to emit laser light having a wavelength of 0.98 µm. Because it is required to adjust the wavelength of the laser light to the absorption wavelength of Er ions, i.e., 0.98 µm, since the semiconductor laser of the first embodiment is used as a light source for exciting an Er-doped fiber amplifier. To put it concretely, as shown in FIG. 3, the active layer 3 is a multi quantum-well layer comprising an $Al_{0.2}Ga_{0.8}As$ barrier layer 31 having a thickness of 20 nm, two $In_{0.16}Ga_{0.84}As$ quantum-well layers 32 each having a thickness of 8 nm, and two $Al_{0.2}Ga_{0.8}As$ guiding layers each having a thickness of 30 nm. The AlGaAs barrier layer 31 is sandwiched between the two InGaAs quantum-well layers 32, and further, the InGaAs quantum-well layers 32 are sandwiched between the two AlGaAs guiding layers A description is given of a function of the n type AlGaAs current blocking layer 8 doped with Si in a concentration equal to or larger than $1\times10^{19}$ cm$^{-3}$.

Figure 4:
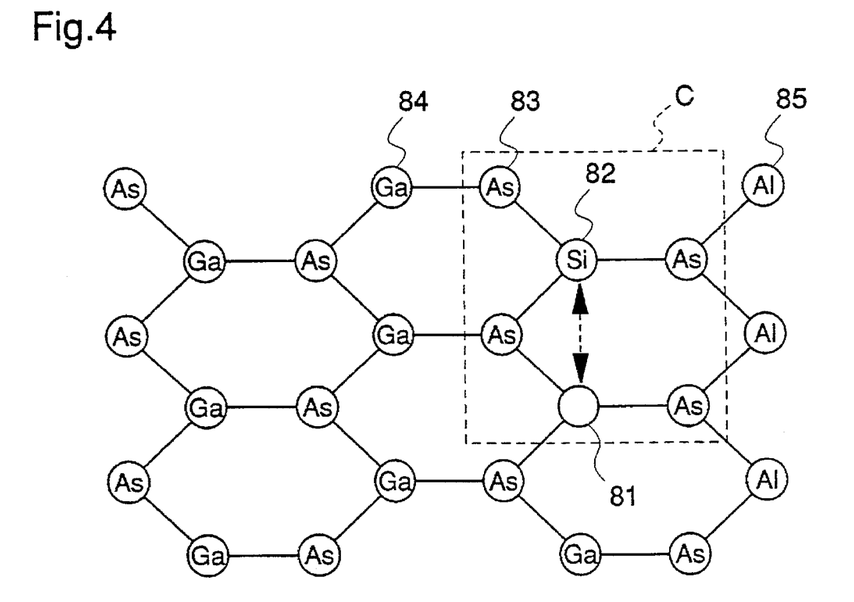
FIG. 4 is a diagram illustrating a molecule structure in a current blocking layer of the semiconductor laser according to the first embodiment of the invention.
Figure 5:
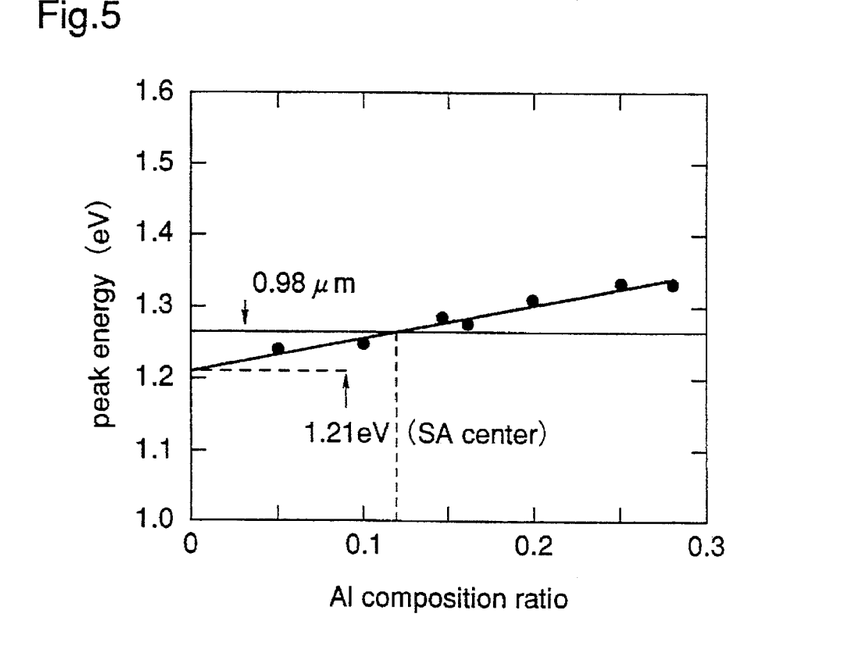
FIG. 5 is a graph showing Al dependency of an emission peak energy of a $V_{III}$-$Si_{Ga}$ complex C in $Al_xGa_{1-x}As$ having an Si concentration of about $1 \times 10^{19}$ cm$^{-3}$.

FIG. 4 is a diagram illustrating a molecule structure in the n type AlGaAs current blocking layer doped with Si to a high concentration. FIG. 5 is a graph showing Al dependency of an emission peak energy of a $V_{III}$-$Si_{Ga}$ complex in $Al_xGa_{1-x}As$ having an Si concentration of about $1\times10^{19}$ cm$^{-3}$.

In FIG. 4, reference numeral 83 designates arsenic (As) as a Group V element, numeral 84 designates gallium (Ga) as a Group III element, numeral 85 designates aluminium (Al) as a Group III element, numeral 81 designates a vacancy of the Group III element site, and numeral 82 designates silicon (Si) as a Group IV element which is put into the gallium site.

When AlGaAs is doped with Si to a high concentration, the silicon 82 put into the gallium site and the vacancy 81 of the Group III element site in the crystal electrically attract each other to produce a $V_{III}$-$Si_{Ga}$ complex C. The complexes C form a broad deep level in a 0.9~1.2 µm wavelength band and absorb light having a wavelength of 0.9~1.2 µm. The light absorption by the complexes C is strongly promoted when the Si concentration is equal to or larger than $1\times10^{19}$ cm$^{-3}$.

These complexes C are produced also when GaAs is doped with Si to a high concentration. When Al is present, however, it is probable that the gallium 84 of the Group III element site moves to produce the vacancy 81 therein. Therefore, in the Si-doped AlGaAs, the $V_{III}$-$Si_{Ga}$ complexes C are produced more easily and in larger quantities than those produced in the Si-doped GaAs, whereby the absorption of the light having a wavelength of 0.9~1.2 µm is promoted more by the complexes C.

A description is given of the Al dependency of the emission peak energy of the $V_{III}$-$Si_{Ga}$ complex C in $Al_xGa_{1-x}As$ having an Si concentration of $3\times10^{18}$ cm$^{-3}$~$1\times10^{19}$ cm$^{-3}$.

The graph shown in FIG. 5 is disclosed in Japanese Journal of Applied Physics, Vol.61, No.9, pp.4603, 1987, T. Oh-hori, et al. The ordinate represents an emission peak energy of Si-doped $Al_xGa_{1-x}As$, and the abscissa represents an Al composition ratio x of the Si-doped $Al_xGa_{1-x}As$.

As shown in FIG. 5, the emission peak energy takes a minimum value of 1.21 eV when Al is not present, i.e., when GaAs is doped with Si, and the peak energy increases as the Al composition ratio x is increased. When the Al composition ratio x is 0.11, the emission peak energy agrees with an emission peak energy of light having a wavelength of 0.98 µm. Since the absorption peak energy is larger than the emission peak energy by 0.1~0.3 eV, an absorption peak energy of the Si-doped $Al_xGa_{1-x}As$ agrees with that of the light having a wavelength of 0.98 µm when the Al composition ratio x is about 0.2. Therefore, when the $Al_xGa_{1-x}As$ having the Al composition ratio x of about 0.2 is doped with Si to a high concentration, the absorption of the light having a wavelength of 0.98 µm is promoted, as compared with when Al is not present.

The Al composition ratio of the AlGaAs current blocking layer 8 is larger than those of the AlGaAs cladding layers 2, 4 and 6, the refractive index of the current blocking layer 8 is smaller than those of the cladding layers 2, 4, and 6, and the semiconductor laser does not include a loss guide type structure. Therefore, it is required that the AlGaAs current blocking layer 8 have an Al composition ratio x smaller than those of the AlGaAs cladding layers 2, 4, and 6. In addition, in order to absorb the laser light having a wavelength of 0.98 µm, it is desirable to use $Al_xGa_{1-x}As$ having an Al composition ratio x larger than 0 and equal to or smaller than 0.3 in the current blocking layer 8. Especially, $Al_xGa_{1-x}As$ having an Al composition ratio x of about 0.2 is the most suitable therefor.

In order to form a deep level in the n type AlGaAs current blocking layer 8, the current blocking layer 8 may be doped with Si to a concentration equal to or larger than $1\times10^{19}$ cm$^{-3}$. However, the Si concentration is limited to about $1\times10^{20}$ cm$^{-3}$ considering the solubility of Si in the crystal.

As described above, according to the semiconductor laser of the first embodiment, the laser light having a wavelength of 0.98 µm, which light is emitted from the active layer 3 just below the ridge waveguide 12, is absorbed by the $V_{III}$-$Si_{Ga}$ complexes C in the Si-doped n type AlGaAs current blocking layer 8. The concentration of the $V_{III}$-$Si_{Ga}$ complexes C increases with an increase in the Si concentration. That is, the current blocking layer 8 in the semiconductor laser according to the first embodiment serves as an absorption layer which absorbs the laser light having a wavelength of 0.98 µm. In this case, the waveguide structure in the semiconductor laser is a loss guide type structure that is different from the refractive index type structure as in the prior art semiconductor laser shown in FIG. 8. In the semiconductor laser including the loss guide type structure, the absorption of the laser light makes the waveguide loss a little larger than that in the refractive index type structure, makes the threshold current larger, and makes the quantum efficiency lower. However, the absorption of the laser light by the current blocking layer 8 is promoted more at the end portions than at the center portion of the ridge waveguide 12, whereby the gains of the higher-order modes having the peaks at the end portions of the ridge waveguide are reduced more than the gains in the prior art semiconductor laser including the refractive index type structure shown in FIG. 8. Therefore, according to this semiconductor laser of the first embodiment, even when the waveguide width Wb is broadened from 1~1.5 µm to 2~4 µm, a unimodal laser beam having a fundamental transverse mode is produced stably. Further, when the waveguide width Wb is 2~4 µm, operating current density at a constant light output is reduced, as compared with when the width Wb is 1~1.5 µm, and optical density at the facet is reduced. Accordingly, reliability of the semiconductor laser is significantly improved. Furthermore, since the waveguide width Wb is broadened, it is possible to suppress the influence of variation of the waveguide width Wb due to instability of the etching on variation of the half-power angular width of the horizontal transverse mode. Consequently, uniformity of device characteristics of the semiconductor laser is improved.

In addition, the semiconductor laser according to the first embodiment includes the current blocking layer 8 comprising $Al_{0.2}Ga_{0.8}As$ which is doped with Si to a concentration equal to or larger than $1 \times 10^{19}$ cm$^{-3}$. Therefore, unlike the prior art semiconductor laser having the narrow absorption band as disclosed in Patent Application 7-178759, the broad deep level is formed in a 0.9~1.2 µm wavelength band by the $V_{III}$-$Si_{Ga}$ complexes C which are produced in the current blocking layer 8. In addition, since the current blocking layer 8 comprises AlGaAs in the semiconductor laser of the first embodiment, the absorption of the light having a wavelength of 0.9~1.2 µm is promoted more than when the current blocking layer comprises GaAs as in the prior art semiconductor laser shown in figure 11.

Therefore, the semiconductor laser according to the first embodiment of the invention reliably suppresses the generation of the higher-order modes for the light having a wavelength of 0.98 µm and stably produces the laser light having a fundamental mode. Consequently, an excellent semiconductor laser for exciting an Er-doped fiber amplifier in a 0.98 µm wavelength band is obtained.

While the ridge waveguide 12 is formed by the selective etching using the etch stopping layer 5, etching depth control may be carried solely by controlling etching time, thereby forming the ridge waveguide 12, without employing the etch stopping layer 5.

[Embodiment 2]

Figure 6:
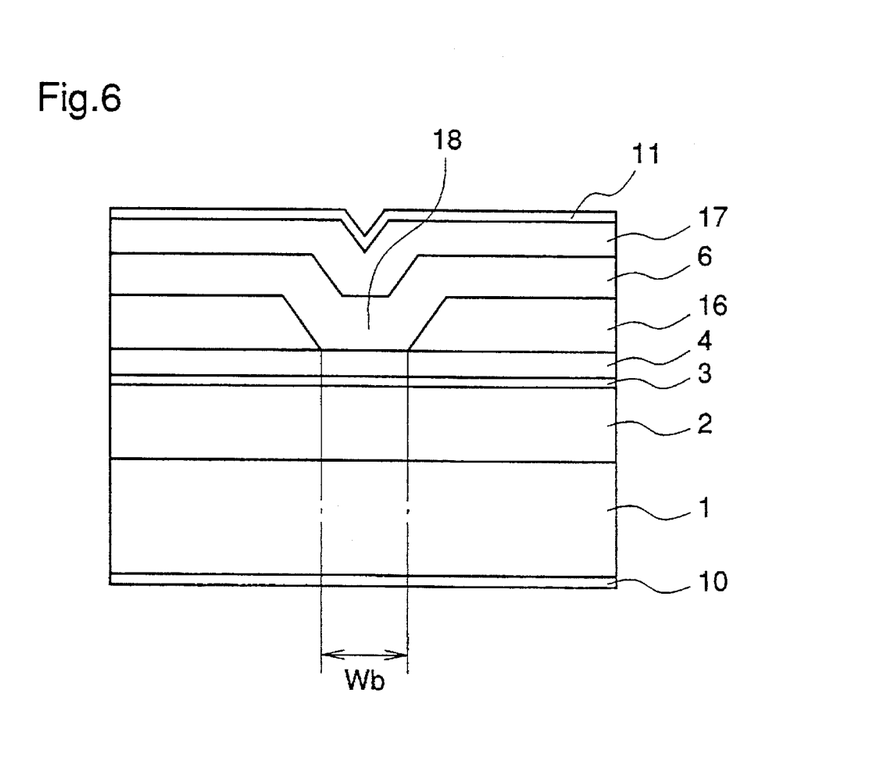
FIG. 6 is a cross-sectional view illustrating a semiconductor laser in accordance with a second embodiment of the present invention.

FIG. 6 is a cross-sectional view illustrating an SAS (self-aligned structure) type semiconductor laser according to a second embodiment of the present invention. This semiconductor laser of the second embodiment is used as a light source for exciting an Er-doped fiber amplifier. In the figure, reference numeral 1 designates an n type GaAs semiconductor substrate. Ann type AlGaAs cladding layer 2 comprising $Al_{0.5}Ga_{0.5}As$ is disposed on the n type GaAs semiconductor substrate 1. A quantum-well active layer 3 comprising undoped InGaAs is disposed on the n type AlGaAs cladding layer 2. A p type AlGaAs first cladding layer 4 comprising $Al_{0.5}Ga_{0.5}As$ is disposed on the quantum-well active layer 3. N type AlGaAs current blocking layers 16 are disposed on the p type AlGaAs first cladding layer 4. The n type AlGaAs current blocking layers 16 comprise $Al_{0.2}Ga_{0.8}As$ doped with Si to a concentration equal to or larger than $1 \times 10^{19}$ cm$^{-3}$. A p type AlGaAs second cladding layer 6 comprising $Al_{0.5}Ga_{0.5}As$ is disposed on the n type AlGaAs current blocking layers 16 and on a portion of the p type AlGaAs first cladding layer 4 where the current blocking layer 16 is absent. Reference numeral 18 designates a waveguide, and the waveguide 18 has a width Wb in a range of 2~4 µm at a boundary between the waveguide and the p type AlGaAs cladding layer 4. A p type GaAs contact layer 17 is disposed on the p type AlGaAs second cladding layer 6. A p side electrode 10 is disposed on a rear surface of the n type GaAs semiconductor substrate 1, and an n side electrode 11 is disposed on the p type GaAs contact layer 17.

The semiconductor laser according to the second embodiment differs from the prior art semiconductor laser in that the current blocking layer is the n type AlGaAs layer comprising $Al_{0.2}Ga_{0.8}As$ having an Al composition ratio x of 0.2 which is doped with Si to a concentration equal to or larger than $1 \times 10^{19}$ cm$^{-3}$. The waveguide structure in this semiconductor laser is a loss guide type structure that is different from the refractive index type structure as in the prior art semiconductor laser shown in FIG. 8.

A description is given of the fabricating method.

Figure 7:
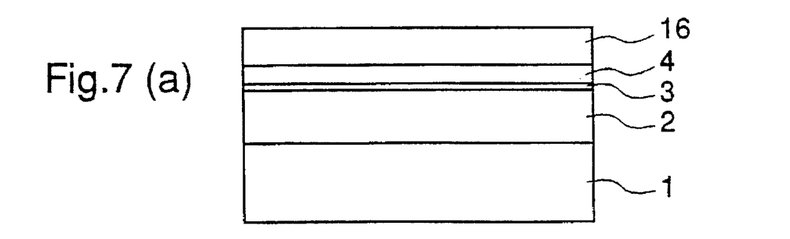
FIGS. 7(a)-7(e) are cross-sectional views illustrating process steps in a method of fabricating the semiconductor laser according to the second embodiment of the invention.

FIGS. 7(a)-7(e) are cross-sectional views illustrating process steps in the fabricating method. Initially, as shown in FIG. 7(a), the n type AlGaAs cladding layer 2, the quantum-well active layer 3, the p type AlGaAs first cladding layer 4, and the n type AlGaAs current blocking layer 16 comprising $Al_{0.2}Ga_{0.8}As$ having an Al composition ratio of 0.2 which is doped with Si to a concentration equal to or larger than $1 \times 10^{19}$ cm$^{-3}$ are successively epitaxially grown on the n type GaAs semiconductor substrate 1, preferably by MOCVD. The growth of the layers, except the active layer 3, is carried out under the conditions of a growth temperature of about 700° C., a V/III ratio of 200, and a growth speed of 1 µm/h.

Next, as shown in FIG. 7(b), an insulating film having a stripe-shaped aperture is deposited on the n type AlGaAs current blocking layer 16. In the step of figure 7(c), using the insulating film 130 as a mask, the n type AlGaAs current blocking layer 16 is selectively etched until a surface of the p type AlGaAs first cladding layer 4 is exposed, thereby forming a stripe groove in the n type AlGaAs current blocking layer 16.

Thereafter, as shown in FIG. 7(d), after removing the insulating film 130 by etching, the p type AlGaAs second cladding layer 6 is grown on the entire surface of the n type AlGaAs current blocking layer 16 and on the exposed surface of the p type AlGaAs first cladding layer 4 to bury the stripe groove in the n type AlGaAs current blocking layer 16. Subsequently, as shown in FIG. 7(e), the p type GaAs contact layer 17 is grown on the p type AlGaAs second cladding layer 6.

Finally, the n side electrode 10 is formed on the n type GaAs semiconductor substrate 1 and the p side electrode 11 is formed on the p type GaAs contact layer 17, preferably by vacuum evaporation, resulting in the SAS type semiconductor laser shown in FIG. 6. The semiconductor laser according to the second embodiment is used as a light source for exciting an Er-doped fiber amplifier. Therefore, the quantum-well active layer 3 is formed so as to emit laser light having a wavelength of 0.98 µm as in the first embodiment of the invention (refer to FIG. 3).

The semiconductor laser of the second embodiment has the same function and effect as those of the ridge type semiconductor laser of the first embodiment. More specifically, the $V_{III}$-$Si_{Ga}$ complexes C are produced in the n type AlGaAs current blocking layer 16, and the complexes C form the broad deep level absorbing light having a wavelength of 0.9~1.2 µm. Since the current blocking layer 16 comprises AlGaAs, the absorption of the light having a wavelength of 0.9~1.2 μm is promoted more than when the current blocking layer comprises GaAs. As the result, the absorption of the laser light emitted from the active layer 3 just below the waveguide 18 by the current blocking layer 16 is promoted more at the end portions than at the center portion of the waveguide 18, whereby the gains of the higher-order modes having the peaks at the end portions of the waveguide 18 are reduced. Therefore, even when the waveguide width Wb is broadened, the semiconductor laser according to the second embodiment of the invention reliably suppresses the generation of the higher-order modes for the light having a wavelength of 0.98 μm and stably produces the laser light having a fundamental mode. Consequently, an excellent semiconductor laser for exciting an Er-doped fiber amplifier in a 0.98 μm wavelength band is obtained.

In the second embodiment of the invention, the etching depth control is carried out solely by controlling etching time, thereby forming the stripe groove, without employing the etch stopping layer 5 as in the first embodiment. However, the stripe groove may be formed by forming a p type AlGaAs etch stopping layer on the p type AlGaAs first cladding layer 4, and carrying selective etching.

The semiconductor laser according to the present invention is not limited to a light source for exciting an Er-doped fiber amplifier as in the first and second embodiments. For example, if the quantum-well active layer is formed so as to emit laser light having a wavelength of 1.02 μm, the semiconductor laser may be used as a light source for exciting a Pr-doped fiber amplifier.

What is claimed is:

1. A semiconductor laser including:

a n type GaAs semiconductor substrate;

an n type AlGaAs cladding layer;

an active layer producing light having a wavelength no shorter than 900 nm;

a p type AlGaAs cladding layer having an Al composition ratio; and an n type AlGaAs current blocking layer having a current concentrating structure, the n type AlGaAs current blocking layer comprising $Al_xGa_{1-x}Al$ having an Al composition ratio x smaller than the Al composition ratio of the p type AlGaAs cladding layer, the current blocking layer being doped with Si in a concentration no smaller than $1 \times 10^{19} cm^{-3}$, and the current concentrating structure being a ridge structure comprising the p type AlGaAs cladding layer and having a striped-shaped ridge structure, and the n type AlGaAs current blocking layer disposed on both sides of the ridge of the p-type AlGaAs cladding layer.

2. The semiconductor laser of claim 1 wherein the n type AlGaAs current blocking layer has an Al composition ratio x larger than 0 and no larger than 0.3.

3. A semiconductor laser including;

a n type GaAs semiconductor substrate;

an n type AlGaAs cladding layer;

an active layer producing light having shorter than 900 nm;

a p type AlGaAs cladding layer having an Al composition ratio; and an n type AlGaAs current blocking layer having a current concentrating structure, the n type AlGaAs current blocking layer comprising $Al_xGa_{1-x}Al$ having an Al composition ratio x smaller than the Al composition ratio of the p type AlGaAs cladding layer, the current blocking layer being doped with Si in a concentration no smaller than $1 \times 10^{19} cm^{-3}$, and the current concentrating structure being an SAS (self-aligned structure) structure comprising the n type AlGaAs current blocking layer having a central stripe groove, and the p type GaAs cladding layer disposed on the n type AlGaAs current blocking layer including the stripe groove.

4. The semiconductor laser of claim 3 wherein the n type AlGaAs current blocking layer has an Al composition ratio x larger than 0 and no larger than 0.3.

* * * * *

UNITED STATES PATENT AND TRADEMARK OFFICE
CERTIFICATE OF CORRECTION

PATENT NO. : 5,661,743
DATED : August 26, 1997
INVENTOR(S) : Nagai

It is certified that error appears in the above-indentified patent and that said Letters Patent is hereby corrected as shown below:

Column 14, Line 19, after "having" insert -- a wavelength no--.

Signed and Sealed this

Thirteenth Day of January, 1998

Attest:

Attesting Officer

BRUCE LEHMAN

Commissioner of Patents and Trademarks